United States Patent
Li et al.

(10) Patent No.: US 11,569,345 B2
(45) Date of Patent: Jan. 31, 2023

(54) GAS DOPANT DOPED DEEP TRENCH SUPER JUNCTION HIGH VOLTAGE MOSFET

(71) Applicant: Alpha and Omega Semiconductor (Cayman) Ltd., Grand Cayman (KY)

(72) Inventors: Wenjun Li, Portland, OR (US); Lingbing Chen, Portland, OR (US); Lingpeng Guan, San Jose, CA (US); Jian Wang, Portland, OR (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

(21) Appl. No.: 17/101,702

(22) Filed: Nov. 23, 2020

(65) Prior Publication Data
US 2022/0165843 A1   May 26, 2022

(51) Int. Cl.
*H01L 29/06* (2006.01)
*H01L 29/66* (2006.01)
*H01L 29/78* (2006.01)
*H01L 21/223* (2006.01)

(52) U.S. Cl.
CPC ...... *H01L 29/0634* (2013.01); *H01L 29/0653* (2013.01); *H01L 29/66712* (2013.01); *H01L 29/7811* (2013.01); *H01L 21/223* (2013.01)

(58) Field of Classification Search
CPC ........... H01L 29/0634; H01L 29/66712; H01L 21/223; H01L 29/7811
See application file for complete search history.

(56) References Cited

U.S. PATENT DOCUMENTS

| | | | |
|---|---|---|---|
| 6,509,240 B2 | 1/2003 | Ren et al. | |
| 6,576,516 B1 * | 6/2003 | Blanchard | H01L 29/7802 257/E29.066 |
| 8,673,700 B2 | 3/2014 | Yedinak et al. | |
| 8,765,609 B2 * | 7/2014 | Parthasarathy | H01L 21/76224 257/330 |
| 8,779,423 B2 | 7/2014 | Liu et al. | |
| 9,312,381 B1 | 4/2016 | Bobde et al. | |
| 10,804,376 B2 * | 10/2020 | Takagi | H01L 21/02532 |

(Continued)

OTHER PUBLICATIONS

"Ion Implantation with Photoresist Masks" Basics of Mircrostructuring, MicroChemicals, Available at: https://www.microchemicals.com/technical_information/ion_implantation_photoresist.pdf Accessed: Nov. 2, 2020.

(Continued)

*Primary Examiner* — Bilkis Jahan
*Assistant Examiner* — Victor V Barzykin
(74) *Attorney, Agent, or Firm* — JDI Patent; Joshua D. Isenberg; Robert Pullman

(57) ABSTRACT

A method for manufacturing and a Super Junction MOSFET are disclosed. The Super Junction MOSFET comprises a lightly doped epitaxial layer of a first conductivity type on a heavily doped substrate of the first conductivity type. A deep trench is formed in the epitaxial layer. The deep trench having an insulating layer with a thickness gradient formed on surfaces of the deep trench. One or more regions of the epitaxial layer proximate to sidewalls of the deep trench is doped of a second conductivity type, wherein the second conductivity type is opposite the first conductivity type. Finally, MOSFET device structures are formed in the epitaxial layer.

24 Claims, 17 Drawing Sheets

(56) References Cited

U.S. PATENT DOCUMENTS

| | | | |
|---|---|---|---|
| 2003/0122189 A1* | 7/2003 | Blanchard | H01L 21/223 257/341 |
| 2003/0203552 A1* | 10/2003 | Blanchard | H01L 29/66712 257/E29.066 |
| 2004/0110333 A1* | 6/2004 | Blanchard | H01L 29/66712 257/E29.066 |
| 2004/0164348 A1* | 8/2004 | Blanchard | H01L 29/0634 257/329 |
| 2006/0071270 A1* | 4/2006 | Shibib | H01L 21/2253 257/E29.022 |
| 2011/0006304 A1* | 1/2011 | Xiao | H01L 29/0634 438/479 |
| 2015/0076589 A1* | 3/2015 | Sato | H01L 29/7802 257/329 |
| 2015/0187872 A1* | 7/2015 | You | H01L 29/7802 257/493 |
| 2018/0083128 A1* | 3/2018 | Yokoyama | H01L 29/0634 |
| 2019/0027555 A1* | 1/2019 | Maeta | H01L 29/7802 |
| 2019/0027563 A1* | 1/2019 | Tan | H01L 29/872 |
| 2020/0273968 A1* | 8/2020 | Takagi | H01L 29/66712 |
| 2021/0013310 A1* | 1/2021 | Leendertz | H01L 29/66734 |
| 2021/0242338 A1* | 8/2021 | Ankoudinov | H01L 29/0696 |
| 2022/0052182 A1* | 2/2022 | Tutuc | H01L 29/0634 |

OTHER PUBLICATIONS

S.G. Kim et al., "Fabrication of Superjunction Trench Gate Power MOSFETs Using BSG-Doped Deep Trench of p-Pillar", 2013 ETRI Journal, vol. 35, No. 4, Aug. 2013.

* cited by examiner

US 11,569,345 B2

GAS DOPANT DOPED DEEP TRENCH SUPER JUNCTION HIGH VOLTAGE MOSFET

FIELD OF THE DISCLOSURE

This disclosure relates in general to metal-oxide-semiconductor field-effect transistors (MOSFETs), and more specifically to an improved superjunction device and a method for fabricating the same.

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like.

Power MOSFETs have typically been developed for applications requiring power switching and power amplification. In a power MOSFET, it is desirable to reduce the resistance of the device during conduction ($R_{ds-on}$) and improve its breakdown voltage (BV). In a transistor, much of the breakdown voltage (BV) is supported by a drift region, which is lowly doped in order to provide a higher breakdown voltage BV. However, the lowly doped drift region also produces high on-resistance ($R_{ds-on}$). In other words, the on-resistance ($R_{ds-on}$) and the breakdown voltage (BV) are in a tradeoff relation to each other. In fact, the on-resistance $R_{ds-on}$ is proportional to $BV^{2.5}$. That is, the on-resistance ($R_{ds-on}$) increases dramatically with an increase in breakdown voltage (BV) for a conventional transistor.

Superjunction device configurations have been employed to provide a way to achieve low on-resistance ($R_{ds-on}$), while maintaining a high off-state breakdown voltage (BV). Superjunction devices include alternating p-type and n-type doped columns arranged in parallel and connecting to each other in the drift region. The alternating p-type and n-type columns are in substantial charge balance. When a reverse-bias voltage is applied to between the drain and the source, these columns deplete one another (i.e., laterally) at a relatively low voltage so as to withstand a high breakdown voltage in the vertical direction. The on-resistance ($R_{ds-on}$) for a super-junction device increases in direct proportion to the breakdown voltage By, which is a much less dramatic increase than in a conventional semiconductor structure. A super-junction device may therefore have significantly lower on-resistance ($R_{ds-on}$) than a conventional MOSFET device for the same high breakdown voltage (BV) (or conversely may have a significantly higher breakdown voltage BV than a conventional MOSFET for a given on-resistance $R_{ds-on}$).

Prior methods of fabricating Super Junction MOSFET devices involve time and resource intensive techniques. There are in general currently two common techniques for fabricating a Super Junction MOSFET. The first technique uses multi-epitaxial layer deposition with P-type columns formed by ion implantation through photo-resist masks between epitaxial layer deposition stages. The second technique involves P-type epitaxial growth in a trench.

The technique for fabricating Super Junction MOSFETs using multi-epitaxial layers with ion implantation of P-type columns is very costly. This technique requires multiple epitaxial layer growth phases, masking phases and ion implantation phases to create P-type columns and N-type columns. The epitaxial growth phases and ion implantation phases are time consuming and with each masking there is the danger that there is alignment error in the masking causing misalignment of the P implant. Devices with misaligned P columns are discarded thus decreasing the number of devices yielded by the process and further increasing the cost per device. Thus, the Multi-epitaxial layer with P-type columns process is quite a time consuming and costly process for the manufacture of Super Junction MOSFETS. The second technique of P-type epitaxial growth in a trench creates device with undesirable attributes and is also costly. This technique involves etching a deep wide trench in the epitaxial layer and then filling the trench with P-type epitaxial material. The trenches must be made wide enough to accommodate filling with the P-type material. As such it is not feasible to use this technique to create devices with narrow columns. Additionally, the P-type epitaxial material created used in the formation of the columns is expensive and time consuming to create.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

Figure 1:
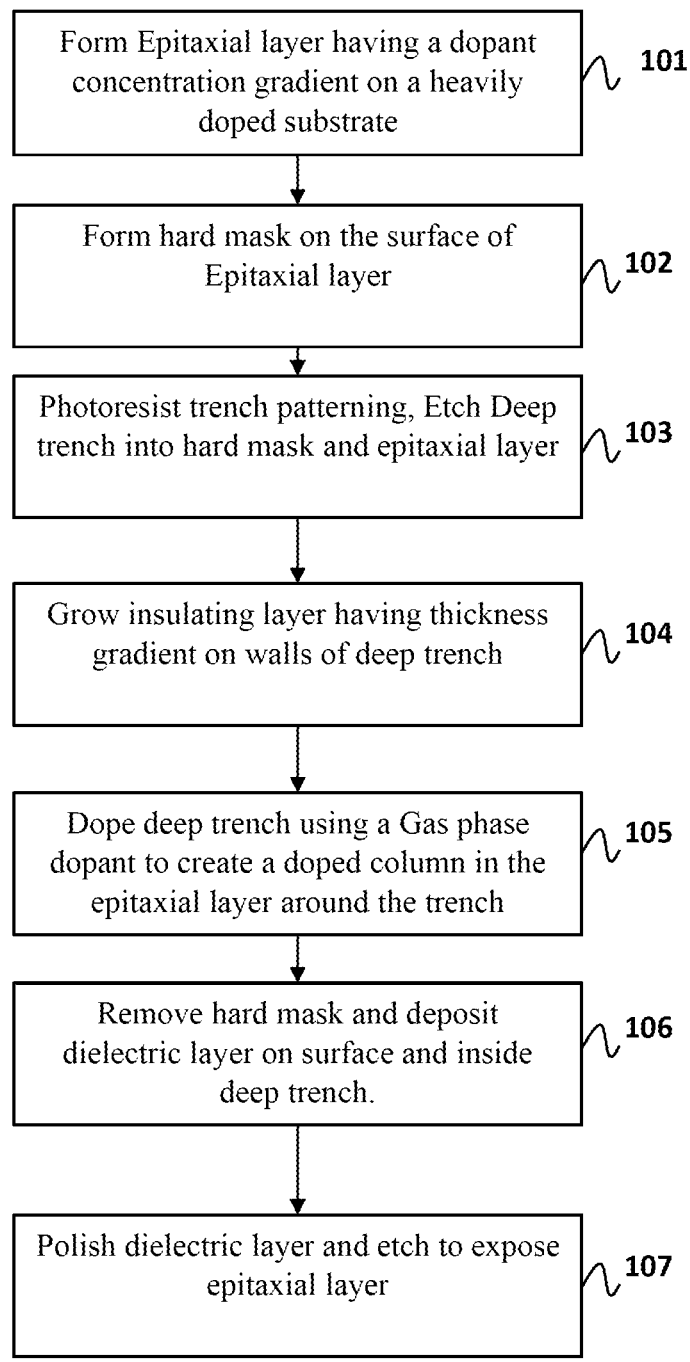
FIG. 1 is a flow diagram showing the improved method for fabrication of Super Junction columns in high voltage MOSFETs according to aspects of the present disclosure.

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general terms, an n+ material has a higher n type net dopant (e.g., electron) concentration than an n material, and an n material has a higher carrier concentration than an n− material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

In order to reduce on-resistance $R_{ds-on}$ as much as possible, aspects of the present disclosure disclose an improved method of fabrication and a new configuration of a power MOSFET structure in a superjunction device. Specifically, the super-junction columns include a void with oxide cap. The method of fabrication presents a more cost effective and efficient process means for creation of a Super Junction MOSFET.

The improved method of manufacture may generally include forming a lightly doped epitaxial layer of a first conductivity type on a heavily doped substrate of the first conductivity type. A silicon hard mask is formed on the surface of the epitaxial layer and etching a deep trench through the hard mask and into the epitaxial layer. An insulating layer having a thickness gradient is formed on the surface of the deep trench and one or more regions of the epitaxial layer proximate to sidewalls of the deep trench are doped with a gas dopant of a second conductivity type, wherein the second conductivity type is opposite the first conductivity type. MOSFET device structures are formed on or in the epitaxial layer. The method may create a device that comprises a substrate heavily doped with a first conductivity type, an epitaxial layer lightly doped with the first conductivity type on the substrate having and a deep trench formed in the epitaxial layer surrounded by a region doped with a second conductivity type in the epitaxial layer wherein the second conductivity type is an opposite of the first conductivity type and wherein the region doped with the second conductivity type forms a column in the epitaxial layer. The device may also include one or more MOSFET device structures.

Method of Fabrication

Figure 4:
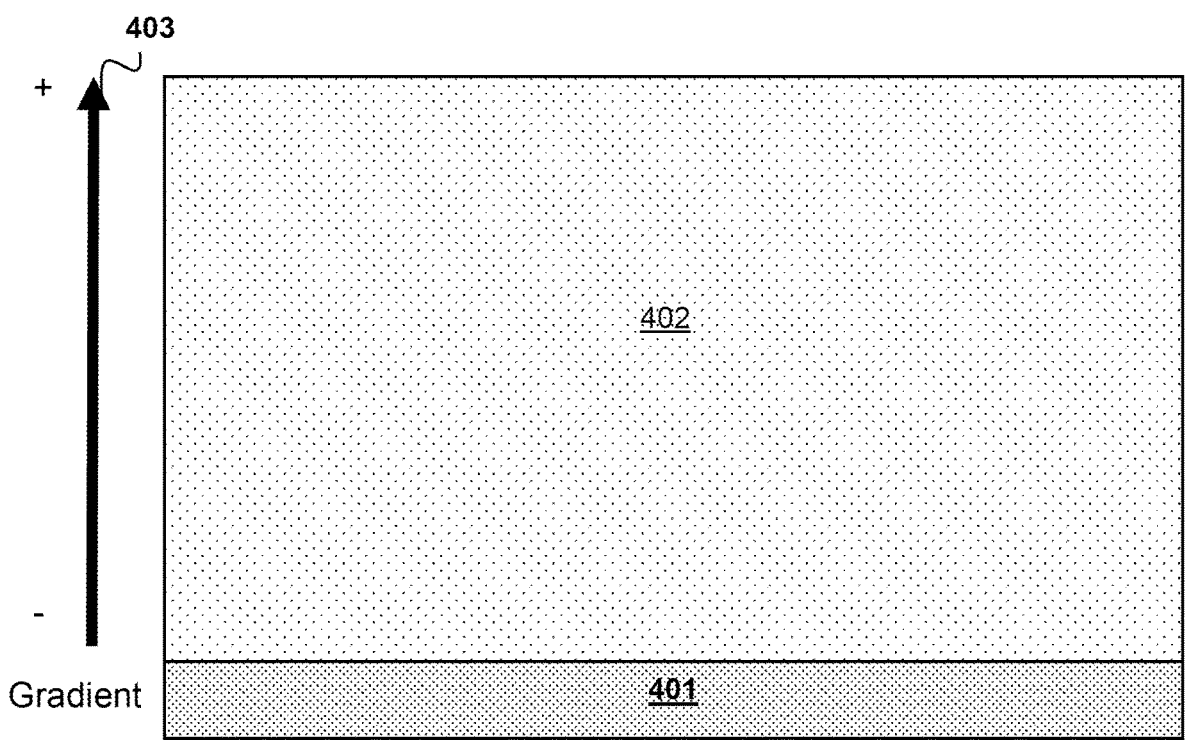
FIG. 4 is a cross sectional view that depicts a substrate with gradient n– epitaxial layer in the improved method of fabrication of Super Junction MOSFETs according to aspects of the present disclosure.

FIG. 1 is flow diagram showing the improved method for fabrication of Super Junction columns in high voltage MOSFETs according to aspects of the present disclosure. The method begins with a substrate heavily doped with a first conductivity type. Typically, the substrate is heavily doped with dopants of a first conductivity type such as N type dopants. An epitaxial layer of the first conductivity type is formed on the surface of the substrate as shown at step 101. Formation of the epitaxial layer is performed through epitaxy, crystal growth. FIG. 4 is a side view of the substrate 401 and epitaxial layer 402 generated at step 101. As shown, the epitaxial layer is at a slight gradient 403 with a lower doping concentration closer to the substrate and a higher doping concentration farther from the substrate. The slight gradient of the epitaxial layer aids in the formation uniform doping concentration columns by gas diffusion. The slight doping concentration gradient may be generated during the epitaxy by starting with a relatively low concentration of dopant and gradually increasing the concentration as the epitaxy process continues to completion. After formation of the epitaxial layer, a hard mask is formed on the surface of the epitaxial layer as shown in step 102. The mask may be a triple layer hard mask including a silicon nitride layer (SIN) sandwiched between two silicon dioxide (SiO2) layers. Such a triple layer hard mask may be formed by growing a thermal oxide layer on the surface of the epitaxial layer followed by deposition of the silicon nitride layers by LPCVD on the surface of the oxide and backside of the wafer. The Silicon nitride layer is deposited by LPCVD in furnace, the silicon nitride layers will be deposited onto both of wafer surface and wafer backside. Silicon nitride on wafer backside will prevent gas dopant diffusion into wafer backside during gas doping process. A third layer of oxide is then deposited by PECVD (Plasma Enhanced CVD) only upon the silicon nitride layer on top of wafer surface forming a three-layer oxide-nitride-oxide hard mask. A three-layer oxide-nitride-oxide hard mask is advantageously resistant to permeation of dopant gases and thus protects the underlying epitaxial layer from diffusion and undesirable doping.

Figure 5:
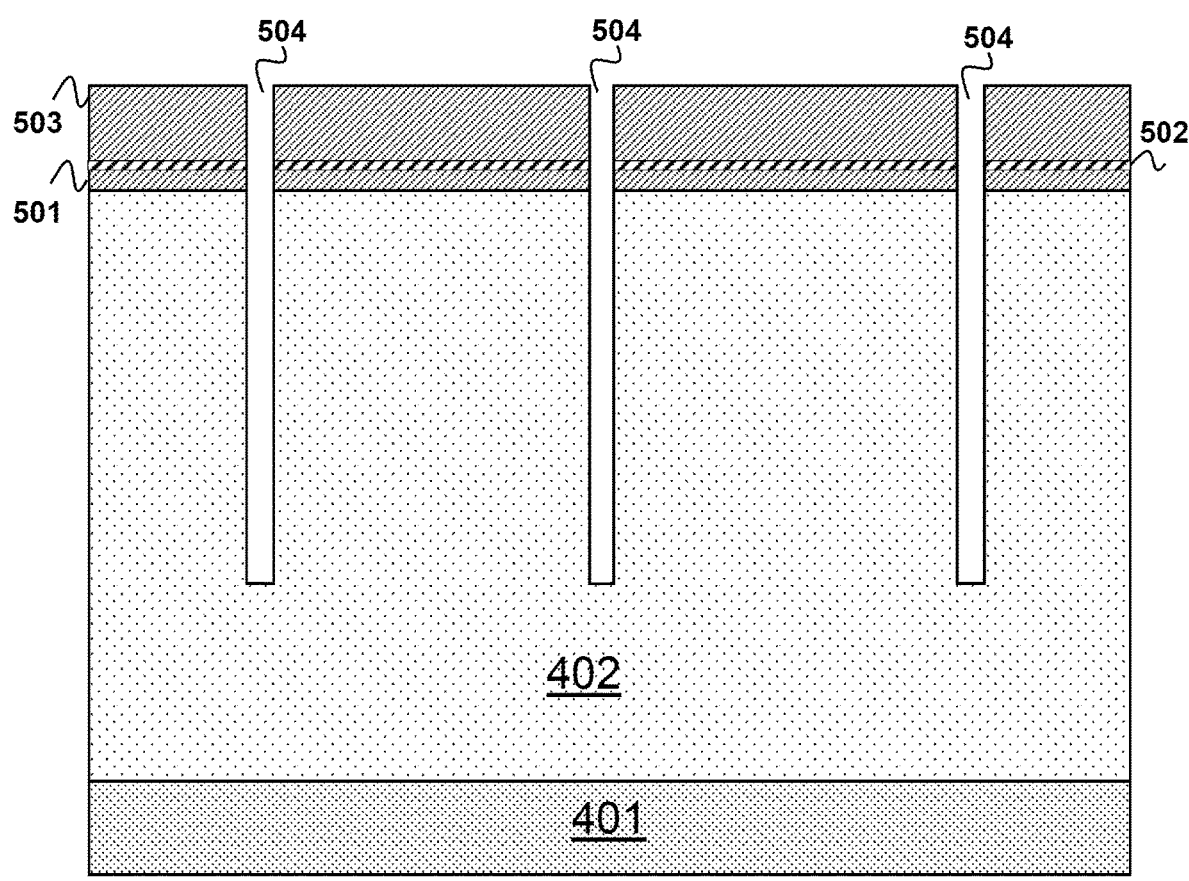
FIG. 5 is a cross sectional view that shows a substrate with hard mask and deep trenches in the epitaxial layer in the improved method of fabrication of Super Junction MOSFETs according to aspects of the present disclosure.

As shown in FIG. 5, each of the layers of the oxide-nitride-oxide hard mask may vary in thickness. The oxide layer 501 closest to the epitaxial layer 402 may be between 100-200 angstroms thick measuring thickness from the surface of the epitaxial layer. The nitride layer 501 may be between 1500-2000 angstroms thick, measured from the surface of the oxide layer and the top oxide layer may be between 4000-6000 angstroms thick, measured from the surface of the nitride layer. After formation of the triple layer oxide-nitride-oxide layer, deep trenches 504 are etched into the epitaxial layer 402 through the hard mask at step 103. The deep trenches may be created by Deep Reactive Ion Etching (DRIE) and may be between 40-60 microns deep. In some implementations it is desirable that the trench width be made as narrow as possible, for example 0.2-1 microns wide. The bottom of the deep trenches does not reach the interface between the substrate 401 and the epitaxial layer 402. By way of example, and not by way of limitation, between the bottom of the deep trenches and the top of the substrate there may be 3-10 microns of epitaxial layer. The pitch between deep trenches 504 created by DRIE may be between 2 and 10 microns.

Figure 6:
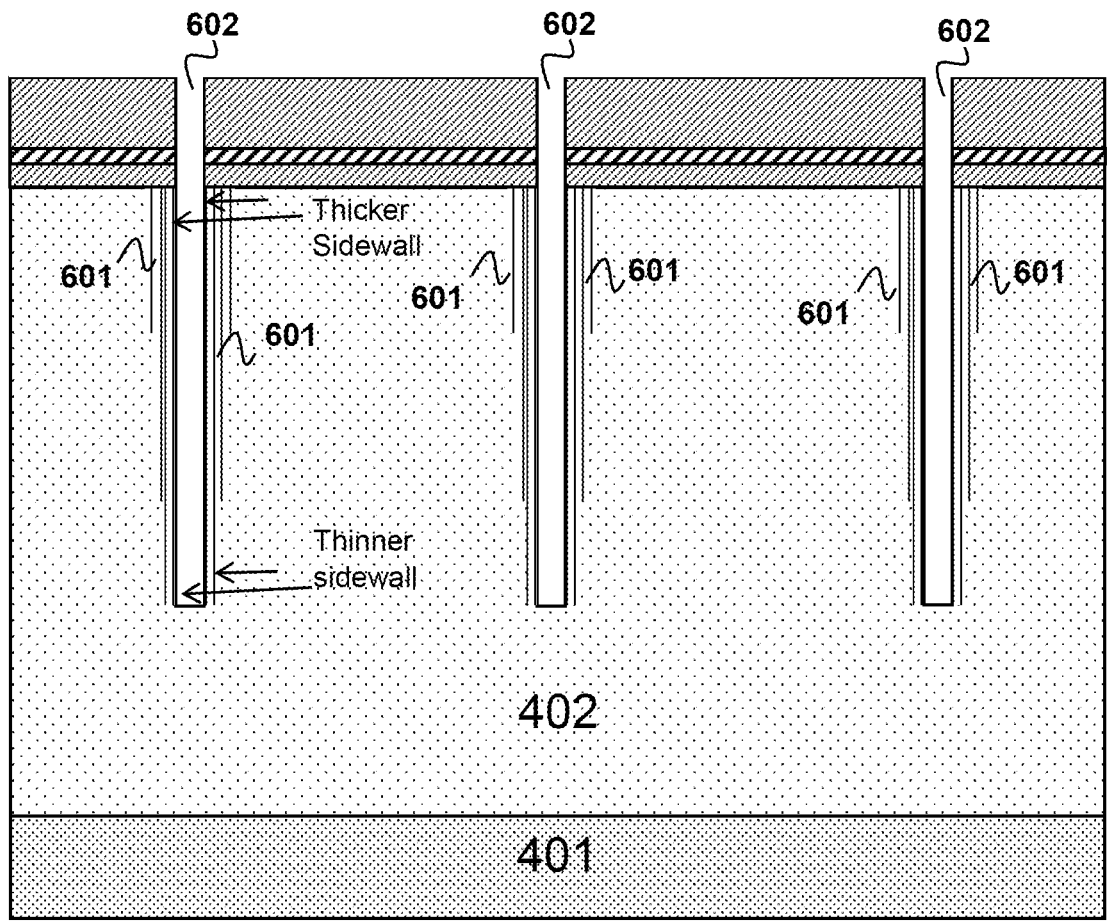
FIG. 6 is a cross sectional view that depicts deep trenches having insulators on the side walls of the deep trenches in the improved method of fabrication of Super Junction MOSFETs according to aspects of the present disclosure.

Next in step 104, as shown in FIG. 6, an oxide layer or other insulating layer 601 is formed on the surface of deep trenches 602. If the insulating layer is an oxide layer, it may be grown inside the deep trenches via a thermal oxidation process. The insulating layer 601 is formed such that there is thickness gradient with the thickest area of the insulating layer 601 near the opening of the deep trenches and the thinnest area of the oxide layer near the bottom of the deep trenches. The gradient of thickness of the insulating layer 601 may be linear or near linear with the thickest portion of the oxide layer being less than 300 angstroms thick and the thinnest portion being greater than 60 Angstroms when measured from the wall side of deep trenches. The difference between the thickest portion of the insulating layer and the thinnest portion of the insulating layer may be between 40 and 200 angstroms. The insulating layer thickness gradient may be achieved by variation in temperature and pressure of the furnace during the thermal oxidation process in the case of an oxide layer such as silicon dioxide ($SiO_2$). The temperature may be varied between 1100° C. and 700° C. The pressure may be varied between 800 mTorr and 80 mTorr.

Figure 7:
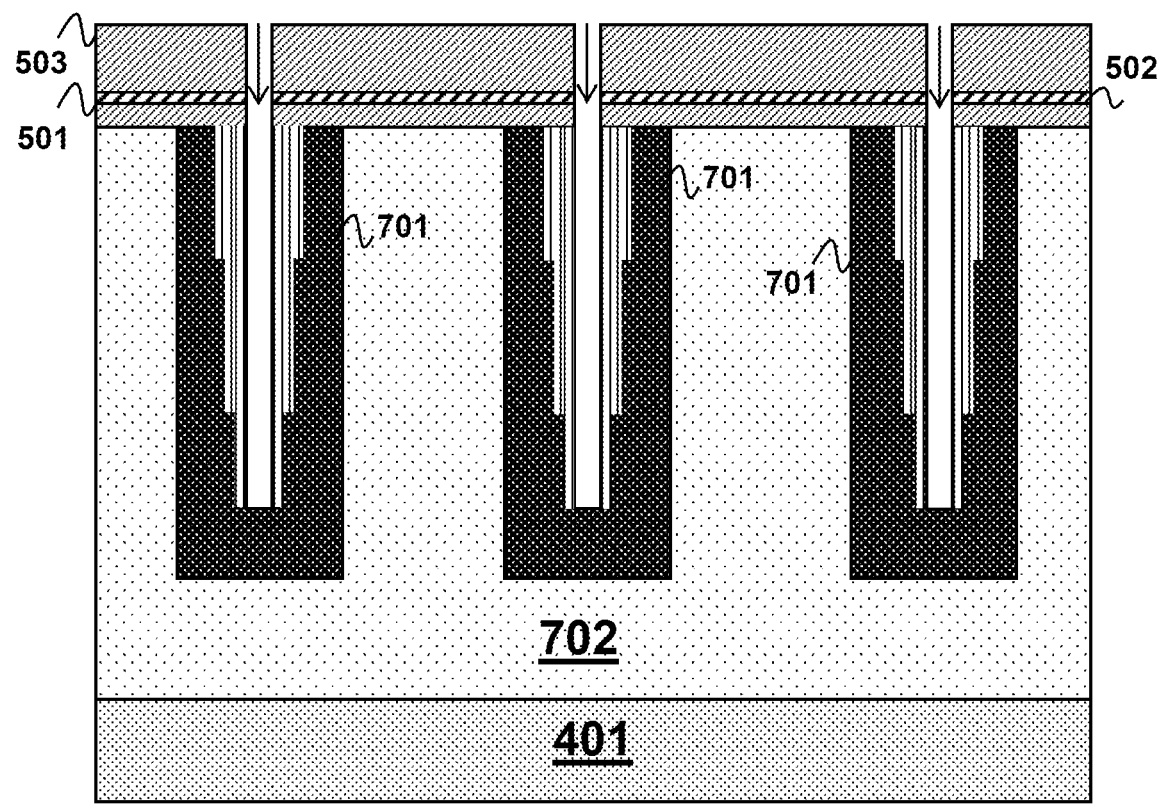
FIG. 7 is a cross sectional view that shows a cut away side view of the substrate and epitaxial layer having columns doped with the second conductivity type surrounding the deep trenches in the improved method of fabrication of Super Junction MOSFETs according to aspects of the present disclosure.

After formation of the insulating layer inside the deep trenches 602 the epitaxial layer may be doped with a second conductivity type (e.g. P-type conductivity) forming a doped pillar proximal to the deep trenches in step 105. FIG. 7 depicts a cut away side view of the substrate 401 and epitaxial layer 702 having columns 701 doped with the second conductivity type surrounding the deep trenches. The columns may be formed by vapor phase doping. The hard mask is preferably impervious to the doping vapor used in the vapor-phase doping to prevent doping of top of the epitaxial layer. The pressure may be varied during the vapor phase doping process from 20 to 200 mTorr. The temperature may also be varied during the vapor phase doping process between 1000° C. to 1200° C. Variations in the temperature or pressure, or temperature and pressure may be used to create an even distribution of dopant through the insulating layer into the walls and bottom of the deep trenches. After the trench sidewalls are doped by the gas dopant, a high temperature anneal process (1000 C to 1200 C) is implemented to further drive the dopant to designed width of P-type columns either in conjunction with an in-situ gas doping process or a separate anneal process.

The vapor phase doping may use any suitable second conductivity type dopant. By way of example and not by way of limitation, if the epitaxial layer is doped N− then the vapor phase dopant may be a P type dopant, e.g., a boron-containing gas such as, Diborane, or any other P-type dopant. The insulating layer also improves the uniform creation of doped columns in the epitaxial layer. The insulating layer (comprised of for example silicon dioxide) has a thickness dependent resistance to the permeation of vapor phase dopant. Thus, the thickness gradient of the insulating layer prevents the upper portion of the epitaxial layer near the opening in the deep trenches from being doped at a higher concentration than the lower portions of the epitaxial layer near the deep trenches. Additionally, the slight gradient of the epitaxial layer may further improve the doping uniformity of the columns A column doped with the second conductivity type 0.5 to 2 microns wide and 42 to 66 microns deep into the epitaxial layer may be generated using vapor phase deposition. The actual doped region may extend 0.5 to 2 microns into the epitaxial layer from bottom of the deep trenches. Outside the doped region columns, regions of the epitaxial layer may form columns of the first conductivity type having between 0.5 and 2 microns in width. In a preferred embodiment, doped region columns of the second conductivity type between adjacent deep trenches are separated a region of the epitaxial layer forming a column of the first conductivity and achieve substantial charge balance.

Figure 8:
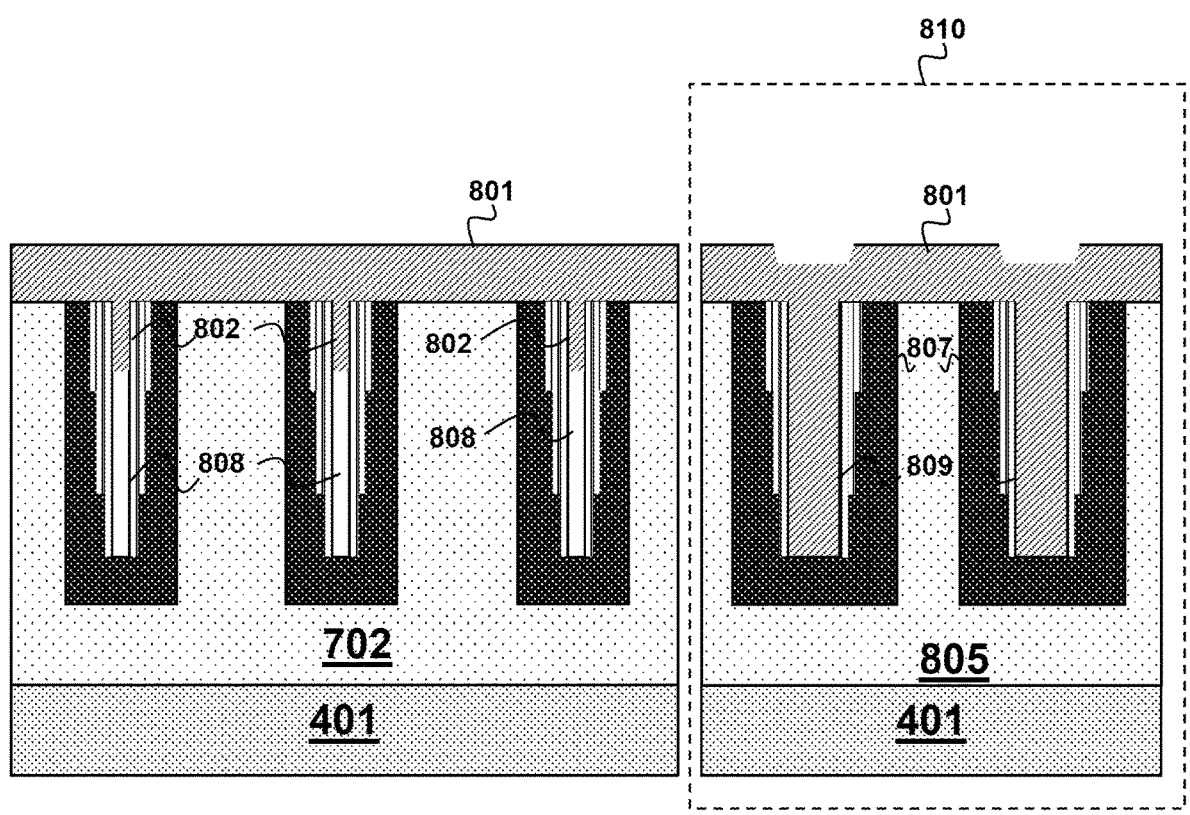
FIG. 8 is a cross sectional view that depicts the formation of the dielectric at the opening of the deep trench in the improved method of fabrication of Super Junction MOSFETs according to aspects of the present disclosure.

Once the columns doped with the second conductivity type the hard mask is removed, a top dielectric layer may be formed on the surface of the epitaxial as shown at 106. As shown in FIG. 8 the top dielectric layer 801 covers the surface of the epitaxial layer 702 and fills the openings 802 of the deep trenches. The top dielectric layer 801 may leave a void or air gap 808 at the bottom of the deep trenches. Ordinarily, a void or air gap would be undesirable in devices fabricated using trench filling. However, in devices of the type described herein, the void or air gap at the bottom of the deep trenches acts as an insulator and has minimal to no effect on the function of the doped columns. The top dielectric layer 801 may comprise any suitable dielectric for example and without limitation an oxide such as silicon dioxide. The top dielectric layer 801 may be formed by chemical vapor deposition, and HDP (High Density Plasma) oxide, and the like. Additionally, the termination region 810 formed in the epitaxial layer 805 over a substrate 401 is shown. The Termination region 810 has wider termination trenches 809 than the deep trenches and may be formed by DRIE or other trench forming methods at the same time as forming the deep trenches. Similar to the deep trenches, the termination trenches 809 are surrounded by a column 807 doped with the second conductivity type created by vapor phase deposition formed by the same process. Unlike the deep trenches the dielectric layer 801 deposited in the termination region 810 fills the entirety of the termination trench 809. The termination region serves to separate active regions of the device that contain transistor structures from other regions of the device.

Figure 9:
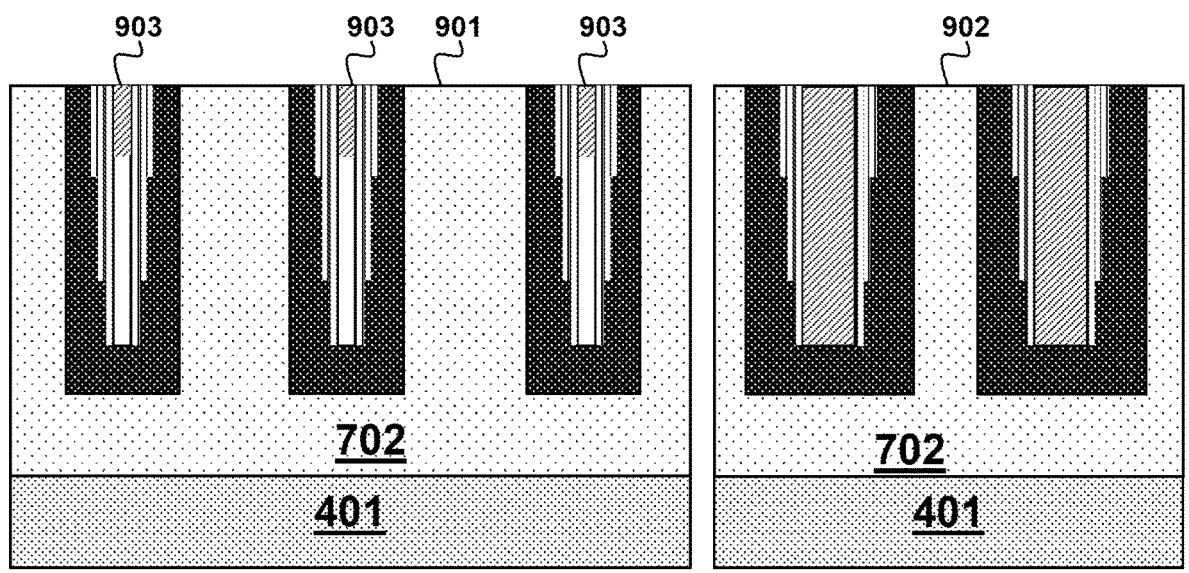
FIG. 9 is a cross sectional view that depicts the removal of the dielectric on the surface of the epitaxial layer in the improved method of fabrication of Super Junction MOSFETs according to aspects of the present disclosure.

Finally, the dielectric layer on the surface of the epitaxial layer is removed, as indicated at 107 in FIG. 1. As shown in FIG. 9 polishing and etching the surface reveals the epitaxial layer 901 of the device region and the epitaxial layer of the termination region 902. The polishing and etching process also leaves dielectric at the opening of the deep trenches 903 forming a dielectric plug in the deep trench and sealing the void at the bottom of the deep trench. Exposing the epitaxial layer allows MOSFET device structures to be formed in the epitaxial layer and on the epitaxial layer as will be discussed.

MOSFET Device Structures

Figure 2:
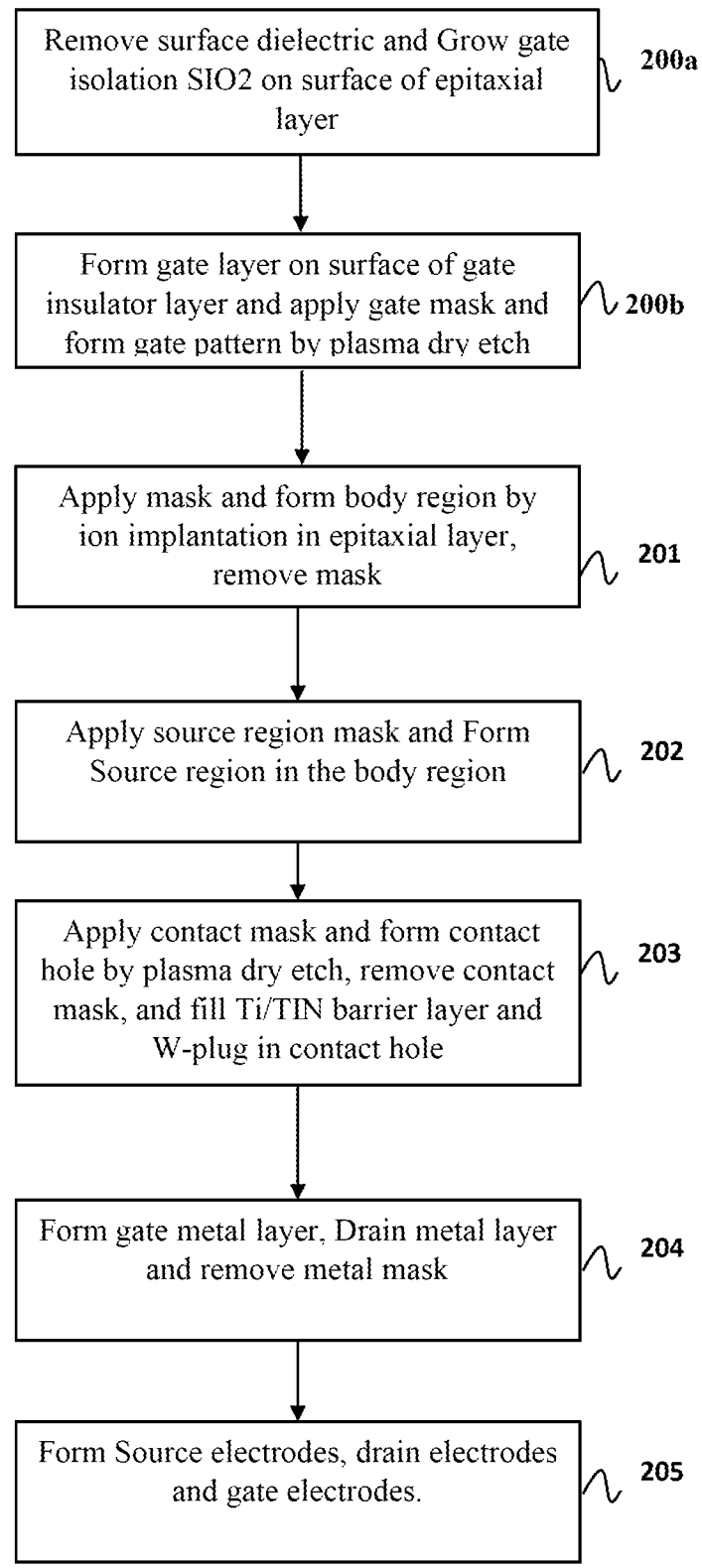
FIG. 2 is a flow diagram showing the improved method for fabrication of other MOSFET structures in Super Junction high voltage MOSFETs according to aspects of the present disclosure.
Figure 10:
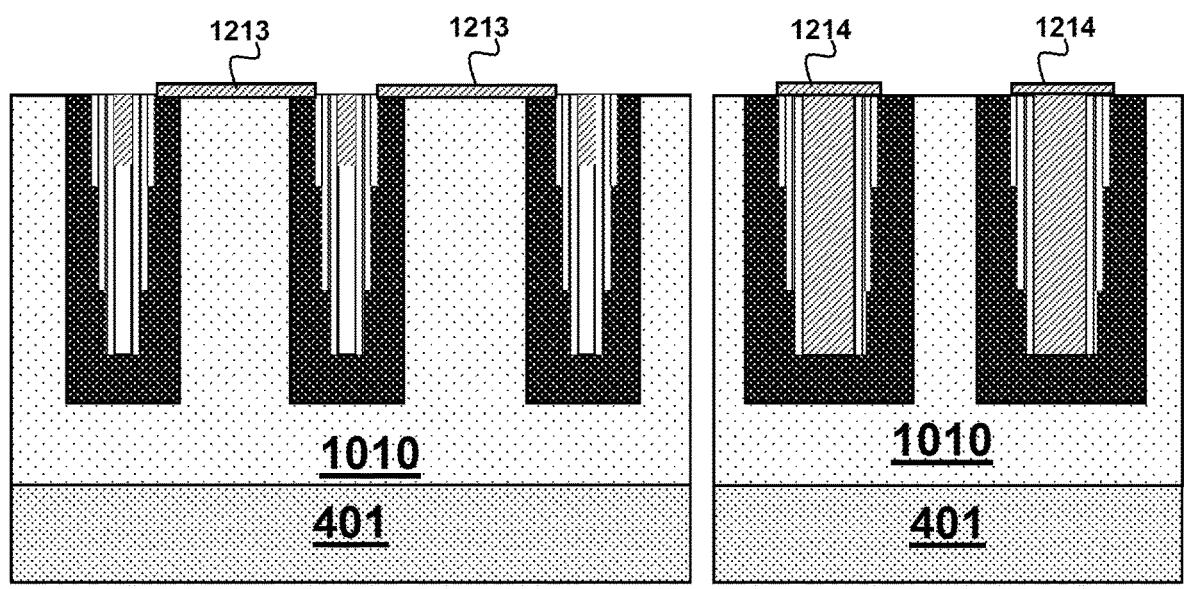
FIG. 10 is a cross sectional view that shows the formation of gate isolators on top of body regions and epitaxial layer in the improved method of fabrication of Super Junction MOSFETs according to aspects of the present disclosure.
Figure 11:
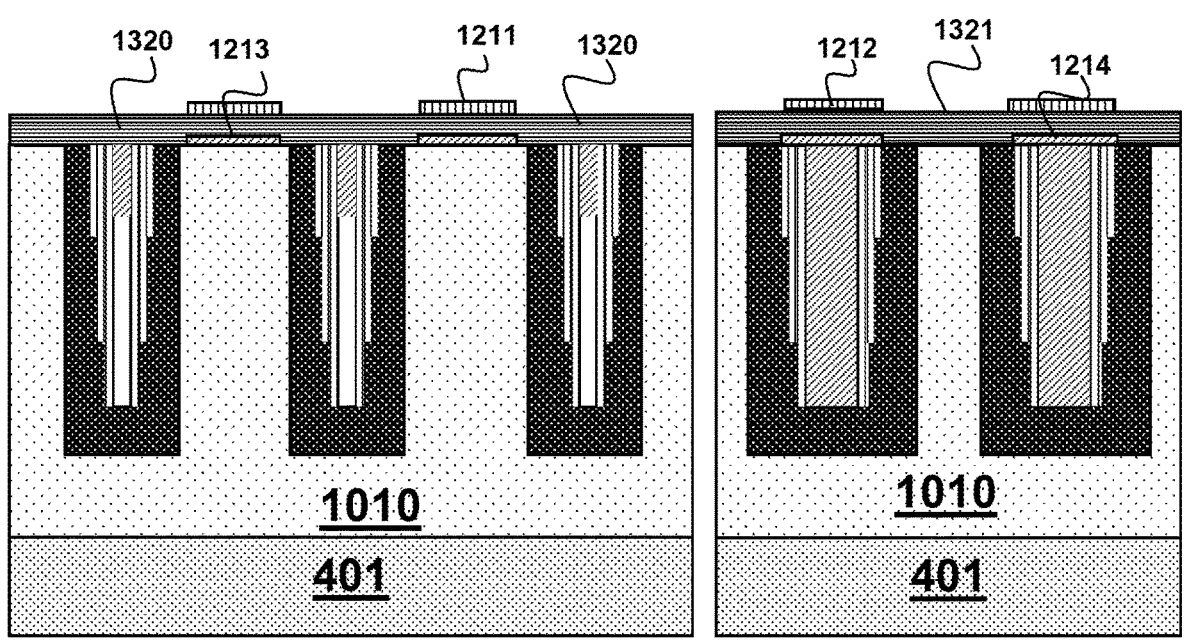
FIG. 11 is a cross sectional view that depicts the formation of poly gate through poly region masks in the improved method of fabrication of Super Junction MOSFETs according to aspects of the present disclosure.

As shown in FIG. 2 at 200a and in FIG. 10, a gate insulator layer 1213 is formed on the surface of epitaxial layer 1010 after removal of any remaining dielectric layer from step 107. The gate insulator 1213 may be for example a 400 to 1200 angstroms thick silicon dioxide ($SiO_2$) layer, which may be formed on the surface of the device via thermal oxide growth, chemical vapor deposition, and the like. Then as shown at 200b in FIG. 2, an electrically conductive gate layer 1320 is formed on top of the gate insulator 1213 as shown in FIG. 11. The gate layer 1320 may be for example and without limitation be polycrystalline silicon (polysilicon) 1000 to 6000 angstroms thick.

Figure 12:
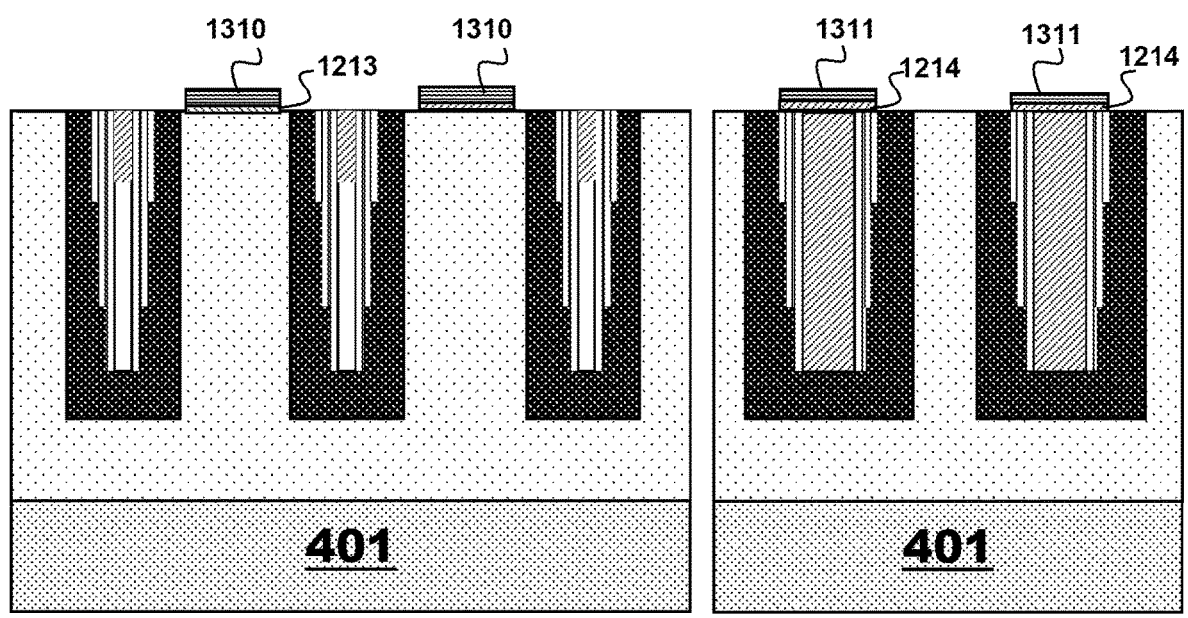
FIG. 12 is a cross sectional view that shows the creation of gate poly and gate dielectrics and termination region gate poly and gate dielectrics in the improved method of fabrication of Super Junction MOSFETs according to aspects of the present disclosure.

As depicted in FIG. 11 a gate mask 1211 is applied to surface of deposited gate layer 1320, the gate mask 1211 may be may be made of any type of mask material, for example a phenol, epoxy, or acrylic-resin photo-resist mask or mechanically applied mask. Gate structures 1310 may then be formed by plasma dry etch of the gate layer 1320 with photoresist as mask. After formation of the gate structures 1310 between adjacent deep trenches with edges away from the doped region columns of the second conductivity type, the gate mask 1211 may be removed by for example washing with a removal solution as shown in FIG. 12. Alternatively, an insulated trench gate (not shown) may be formed in place of the planar gate.

Figure 13:
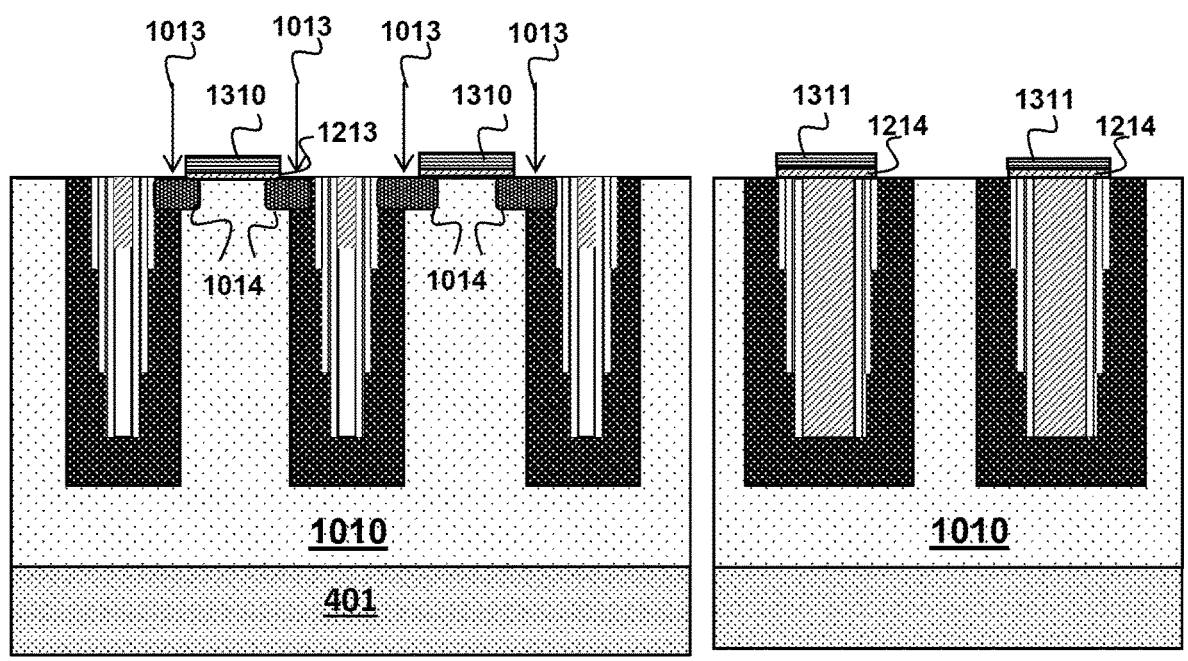
FIG. 13 is a cross sectional view that depicts the formation of body regions through blanket P-type body ion implantation in the improved method of fabrication of Super Junction MOSFETs according to aspects of the present disclosure.
Figure 14:
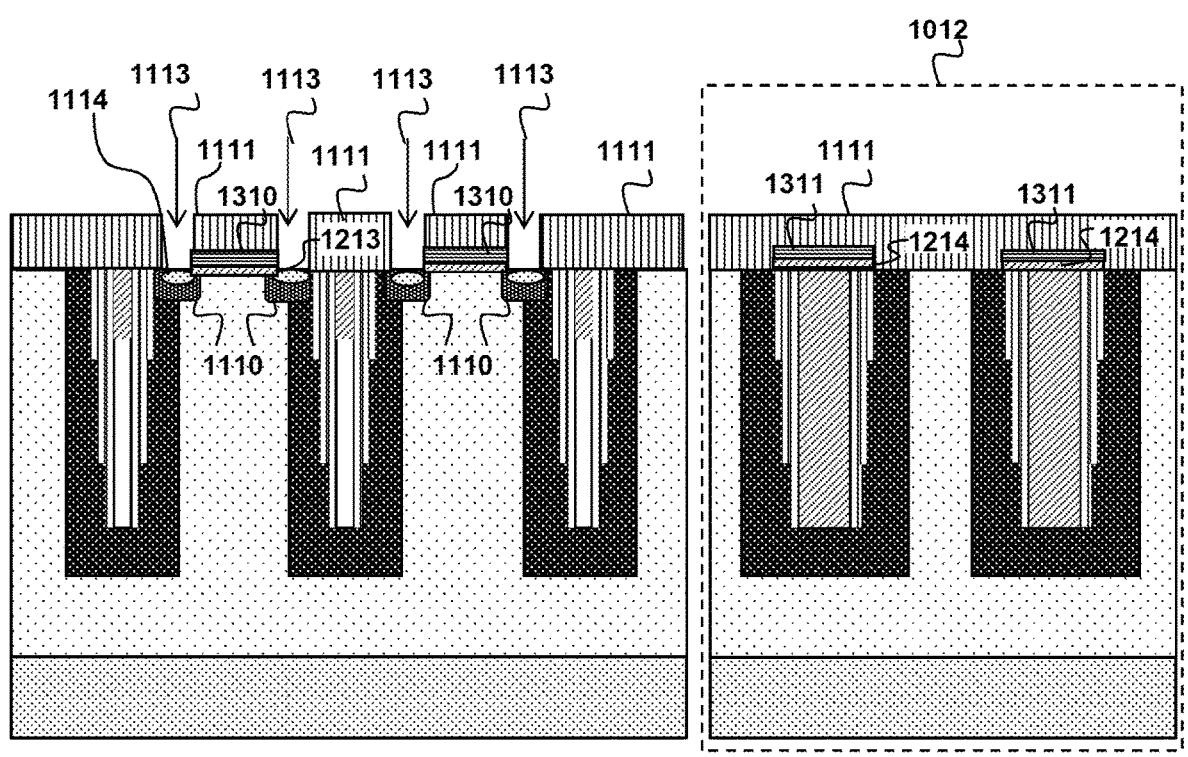
FIG. 14 is a cross sectional view that depicts the formation of source regions through source region masks in the improve method of fabrication of Super Junction MOSFETs according to aspects of the present disclosure.
Figure 15:
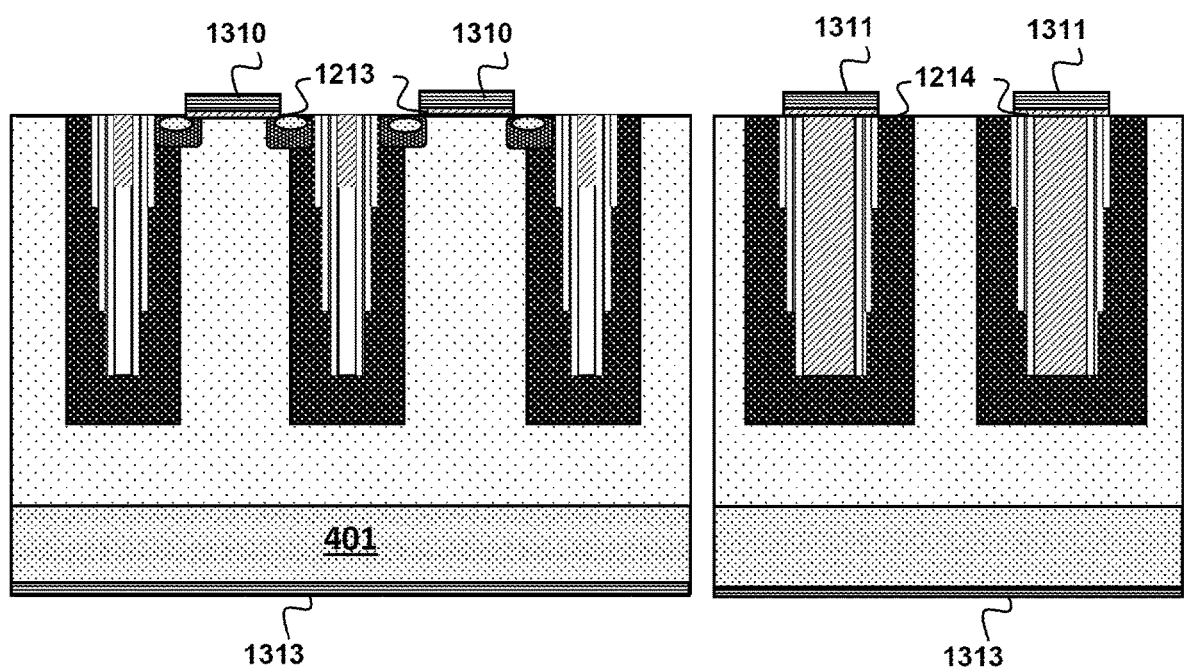
FIG. 15 is a cross sectional view that depicts the formation of gate poly, gate insulators, body regions and source regions post high temperature anneal in fabrication of Super Junction MOSFETs according to aspects of the present disclosure.

As shown at 201 in FIG. 2, the body regions are formed after MOSFET gate structures 1310 are created. FIG. 13 depicts the formation of body regions 1014 in the epitaxial layer 1010. The pattern of gate structures 1310 serves as a mask on the surface of the epitaxial layer 1010 before implantation of ions 1013 into the epitaxial layer 1010 through open spaces in the pattern of gate structures 1310 to form the body regions 1014. Any doping process, for example and without limitation, ion implantation, may be used to form the body regions. The body regions 1014 may be heavily doped with second conductivity type dopants (e.g., P-type dopants if the epitaxial layer is N-type) In the termination region, the termination region poly gate patterns cover the entire termination silicon region preventing implantation of body regions within the epitaxial layer 1010 of the termination region as also described in FIG. 3 at 301. After implantation, a high temperature (for example 1000 to 1200 degree C.) anneal process is implemented to diffuse the body regions 1014 beneath poly gate to form a body overlay with poly structure. The body regions 1014 overlap a top portion of the doped region columns of the second conductivity type. After the body formation, the source region may be formed as indicated at 202 of FIG. 2. By way of example, and not by way of limitation, as shown in FIG. 14 a source mask 1111 is applied to the surface of the epitaxial layer. Similar to the gate mask 1211 discussed above, the source mask 1111 may be any type of mask for example a phenol, epoxy, or acrylic-resin photo-resist mask or mechanically applied mask. The source region 1114 may then be created in the body region 1110 through the gaps in the source region mask 1111 via doping such as implantation of ions 1113. As shown in FIG. 15 after implantation the source mask 1111 may be removed by plasma asking and washing with a removal solution or any other known mask removal technique for example and without limitation planarization or polishing. The mask in the termination 1012 may also be removed at this point by similar or identical methods.

Figure 3:
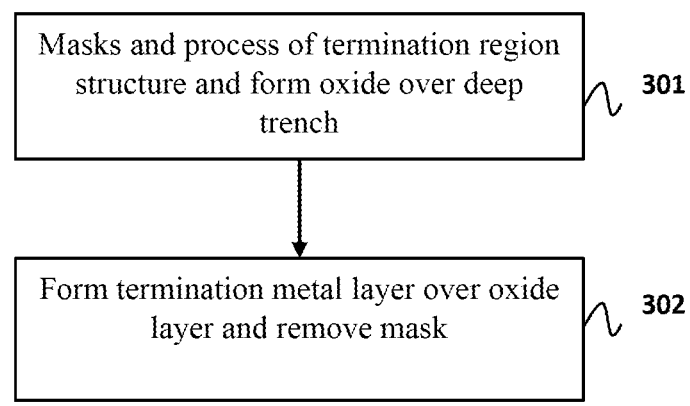
FIG. 3 is a flow diagram depicting the improved method for fabrication of termination region structures in Super Junction high voltage MOSFETs according to aspects of the present disclosure.

In the termination region the termination gate mask 1212 and termination insulator 1214 may be formed as indicated 302 of FIG. 3. The termination insulator 1214 may be formed over top the termination trenches 809. The termination insulator 1214 may also be created during the same process that created the gate insulator layer 1213, and may be an oxide formed on the surface of the device via thermal oxide deposition, chemical vapor deposition etc. etc. as seen in FIG. 10. The termination gate layer 1321 may be created during the same process as the gate layer 1320 as shown in FIG. 11. The termination gate mask 1212 may be over top of the termination trenches 809 on the termination gate layer 1321. The termination gate mask 1212 may be created during the same patterning processes as the gate mask 1211. The termination gate mask 1212 may be any type of mask for example a phenol, epoxy, or acrylic-resin photo-resist mask or mechanically applied mask. After formation of the termination gates 1311 the termination mask 1212 may be removed by for example washing with a removal solution.

Aspects of the present disclosure include implementations in which the gate mask 1211 and termination gate mask 1213 are formed in different processes. Similarly, the gate insulator 1212 and termination insulator 1214 may be formed in separate processes.

Figure 16:
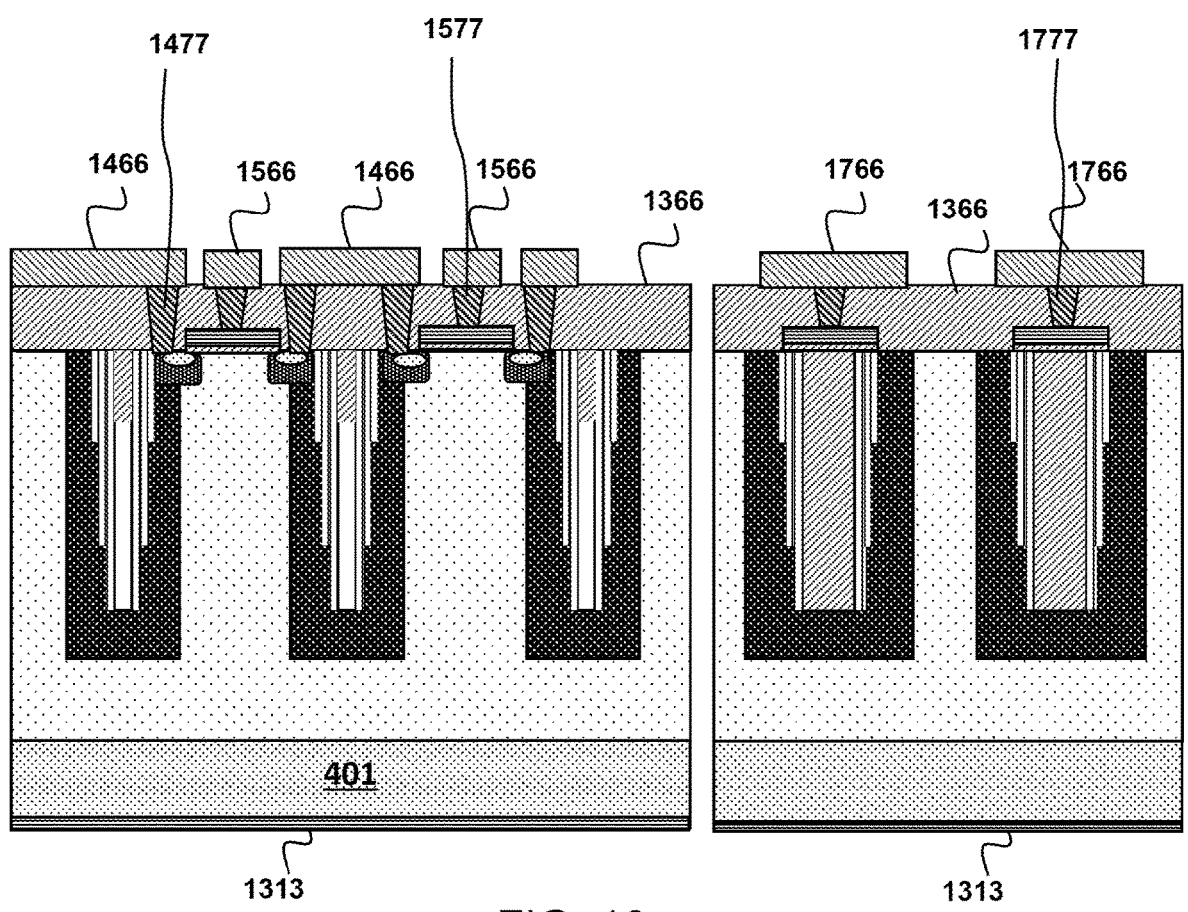
FIG. 16 is a cross section view that depicts the formation of source metal, gate metal and drain metal in fabrication of Super Junction MOSFETs according to aspects of the present disclosure.

FIG. 16 depicts the formation of source contacts 1477 in corresponding source connection holes, gate contacts 1577 in corresponding gate connection holes and termination contacts 1777 in corresponding termination connection holes. An isolation layer 1366 is deposited on top of the wafer surface after source area formation. Then a contact mask is implemented to form source, poly and termination connection hole patterns. The contact holes may be etched by plasma dry etching using a contact mask as shown at 203 of FIG. 2. After dry etching, the contact mask may be removed by plasma ashing and washing with a removal solution or any other known mask removal technique for example and without limitation planarization or polishing. The source contacts 1477, gate contacts 1577, and termination contacts 1777 may be formed in any suitable way. By way of example, and not by way of limitation, a barrier layer of, Ti/TiN, may be formed to line the contact connection holes and remaining portions of the holes may then be filled in with tungsten to form plugs (W-plugs) on top of the barrier layers.

Source metal layers 1466, gate metal layers 1566 and termination metal layer 1766 may be formed on the surface of the device after formation of the contact structures as shown at 204 of FIG. 2. As shown in FIG. 16 a metal layer may be deposited on the surface of isolation layer 1366 and contacts 1477, 1577, and 1777. A metal photoresist mask is applied to surface of the metal layer. Separate source metal layers 1466, gate metal layers 1566 and termination metal layer 1766 may be formed by plasma dry etch of the metal layer through openings in the metal mask.

Another conductive layer 1313 may be formed on the bottom of the substrate 401. The conductive layer 1313 may be a metal layer for the drain.

Figure 17:
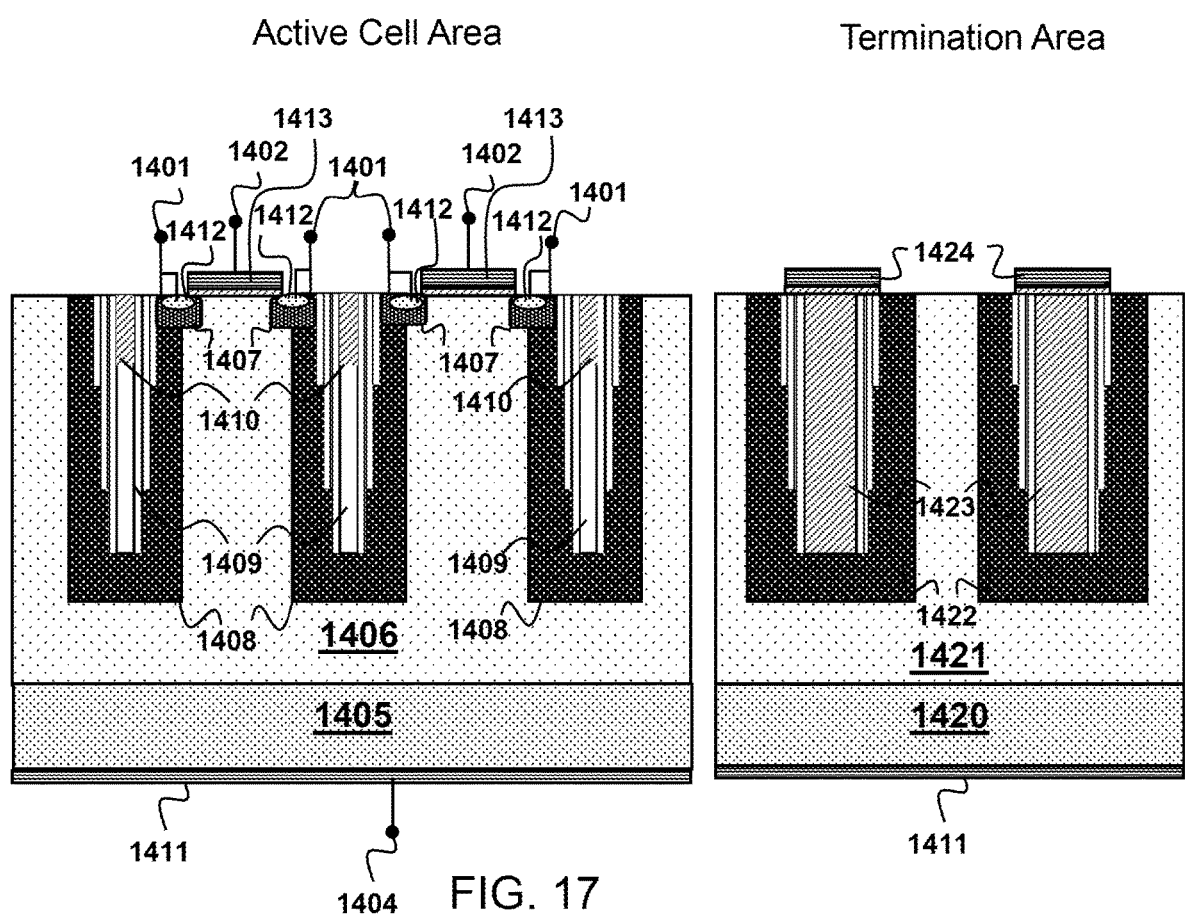
FIG. 17 is a cross sectional view that shows a completed Super Junction MOSFET device according to aspects of the present disclosure.

Completion of the device may include formation 205 of Source contact electrodes 1401, gate contact electrodes 1402 and Drain contact electrodes 1404 as shown in FIG. 17. Device FIG. 17 depicts a completed Super Junction MOSFET device having vapor phase doped columns according to aspects of the present disclosure. The Super Junction MOSFET device includes a substrate region 1405 heavily doped with the first conductivity type, an epitaxial layer 1406 lightly doped with the first conductivity type, Super Junction columns 1408 doped with the second conductivity type. The Super Junction columns may be 42 to 66 Microns in depth from the surface of the epitaxial layer. The Super Junction columns 1408 may have a pitch of 2 to 10 Microns and the space between the Super Junction columns forms epitaxial columns of the first conductivity type that are 0.5 to 2 Microns in width. The Super Junction columns 1408 formed in the epitaxial layer leaves 3 to 10 microns of epitaxial layer 1406 between the bottom of the Super Junction column and the substrate region 1405. The Super junction columns 1408 surround deep trenches 1409, having an empty void at the bottom and a dielectric 1410 at the top of deep trench sealing the deep trench. The deep trench may be 40 to 60 Microns in depth from the surface of the epitaxial layer and the Super Junction column may extend 0.5 to 2 Microns into the epitaxial layer from the deep trench. The deep trenches 1409 also include an insulator layer, such as an oxide layer on the walls. The insulator layers on the walls of the deep trench are created with a gradient of thickness with the thickest portion near the opening of the deep trench and the thinnest portion at the bottom of the deep trench.

Body regions 1407 may be formed in the epitaxial layer 1406 near and over a top portion of the Super Junction columns 1408. The Body regions 1407 may touch at least one of the Super Junction columns 1408 and may be more heavily doped with the second conductivity type than the Super Junction columns. Sections of the Super Junction columns below the body regions 1407 between adjacent deep trenches 1409 are separated by a region of the epitaxial layer therebetween and are substantially in charge balance with the region of the epitaxial layer. Source regions 1412 more heavily doped with the first conductivity type than the epitaxial layer may be formed in the body region 1407. Source contacts 1401 may be formed on the surface of the Source regions 1412 and body regions 1407. Formation of the source contacts 1401 dead shorts the body region 1407 to the source region 1412. Gates 1413 may be formed on the surface of the epitaxial layer 1406. The gates 1413 may be formed between the surfaces of the body regions and may touch the body regions 1407. Additionally, the gate 1413 may overlay with the surface of a source region 1412. The gates 1413 may include an insulator layer on the surface of the epitaxial layer and a metal layer on top of the insulator layer. A gate contact 1402 may be in conductive contact with the gates 1413. A drain metal 1411 may be formed on the bottom of the substrate 1405 and a drain contact 1404 may be in conductive contact to the drain metal 1411.

The termination region includes a substrate region 1420 heavily doped with the first conductivity type, an epitaxial layer region 1421 lightly doped with the first conductivity type, Super Junction termination region columns 1422 doped with the second conductivity type in the epitaxial region 1421. The termination region columns 1422 surround a termination region trench 1423 that is filled with an insulator 1423. A termination region gate 1424 may be formed overtop the opening of the termination region trench 1423 on the surface of the insulator and termination region columns 1422.

It is noted that the substrate regions 1405, 1420 for the MOSFET device and termination regions may be different portions of a common substrate. Likewise, the epitaxial layer regions 1406, 1421 of the MOSFET device and termination regions may be different portions of a common epitaxial layer formed on the common substrate.

Aspects of the present disclosure allow for rapid and economical fabrication of Super Junction devices characterized by alternating N and P columns of fine pitch.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, ¶ 6.

What is claimed is:

1. A method for manufacturing a Super Junction MOSFET comprising;
    a) forming a lightly doped epitaxial layer of a first conductivity type on a heavily doped substrate of the first conductivity type;
    b) forming a hard mask on a surface of the epitaxial layer;
    c) etching a plurality of deep trenches through the hard mask and into the epitaxial layer;
    c') forming an insulating layer on each sidewall of the plurality of the deep trenches;
    d) doping regions of the epitaxial layer proximate to sidewalls of the plurality of deep trenches with a gas dopant of a second conductivity type after forming the insulating layer, wherein the second conductivity type is opposite the first conductivity type;
    e) forming MOSFET device structures in the epitaxial layer.

2. The method of claim 1 wherein the epitaxial layer is doped on a gradient of increasing concentration further from the substrate.

3. The method of claim 1 wherein the insulating layer on each sidewall of the plurality of deep trenches has a gradient thickness.

4. The method of claim 1 wherein the insulating layer on each sidewall of the plurality of deep trenches is thinner near a bottom of the deep trench than near an opening at a top of the deep trench.

5. The method of claim 1 wherein doping the epitaxial layer with the dopant of the second conductivity type forms a column of the second conductivity type in the epitaxial layer around the deep trench and wherein doping the epitaxial layer with the dopant of the second conductivity type include the use of vapor phase doping.

6. The method of claim 5 wherein sections of the columns of the second conductivity type in the epitaxial layer between adjacent deep trenches are separated by a region of the epitaxial layer therebetween and are substantially in charge balance with the region of epitaxial layer.

7. The method of claim 5 wherein the column of the second conductivity type in the epitaxial layer has a uniform dopant concentration.

8. The method of claim 1 wherein the MOSFET device structures includes a plurality of source regions and body regions on a top portion of the epitaxial layer and a plurality of insulated gates.

9. The method of claim 1 further comprising forming a dielectric layer that creates a dielectric seal over an opening of each of the plurality of deep trenches and leaves a unfilled void at a bottom portion of the trench.

10. A method for manufacturing a Super Junction MOSFET comprising;
    a) forming a lightly doped epitaxial layer of a first conductivity type on a heavily doped substrate of the first conductivity type;
    b) forming a hard mask on a surface of the epitaxial layer;
    c) etching a plurality of deep trenches through the hard mask and into the epitaxial layer, wherein etching the plurality of trenches includes formation of a termination region trench in the epitaxial layer, wherein the termination region trench is wider than the deep trench;

d) doping regions of the epitaxial layer proximate to sidewalls of the plurality of deep trenches with a gas dopant of a second conductivity type, wherein the second conductivity type is opposite the first conductivity type;

e) forming MOSFET device structures in the epitaxial layer.

11. The method of claim 10 further comprising formation of an insulating layer that fills the termination region trench with oxide.

12. The method of claim 10 wherein doping the epitaxial layer with the dopant of the second conductivity type forms a column of the second conductivity type in the epitaxial layer around the deep trench and wherein doping the epitaxial layer with the dopant of the second conductivity type include the use of vapor phase doping.

13. The method of claim 12 wherein sections of the columns of the second conductivity type in the epitaxial layer between adjacent deep trenches are separated by a region of the epitaxial layer therebetween and are substantially in charge balance with the region of epitaxial layer.

14. The method of claim 12 wherein the column of the second conductivity type in the epitaxial layer has a uniform dopant concentration.

15. A Super Junction MOSFET device comprising;
a substrate heavily doped with a first conductivity type;
an epitaxial layer lightly doped with the first conductivity type on the substrate;
a plurality of deep trenches formed in the epitaxial layer surrounded by regions doped with a second conductivity type in the epitaxial layer wherein the second conductivity type is opposite to the first conductivity type and a plurality of MOSFET device structures that include a plurality of body regions on top of the regions doped with the second conductivity type, wherein the regions doped with the second conductivity type forms columns under the body regions in the epitaxial layer;
a termination region having a wide trench in the epitaxial layer surrounded by regions doped with the second conductivity type wherein the region doped with the second conductivity type forms a column in the epitaxial layer and wherein the wide trench is filled with a dielectric,
wherein sections of the columns in the epitaxial layer between adjacent deep trenches are separated by a region of the epitaxial layer therebetween and are substantially in charge balance with the region of the epitaxial layer.

16. The device of claim 15 wherein each of the plurality of deep trenches further comprises a dielectric at the opening of the deep trench and a void at the bottom of the deep trench.

17. The device of claim 16 wherein the dielectric at the opening of the deep trench is silicon dioxide.

18. The device of claim 15 wherein the plurality of MOSFET device structures comprise a plurality of insulated gates.

19. The device of claim 15 wherein the plurality of deep trenches has a width between 0.2 and 1 microns and the regions doped with the second conductivity type extends 0.5 to 2 microns from a bottom of the plurality of deep trenches into the epitaxial layer.

20. The device of claim 15 wherein each of the plurality of deep trenches is lined with an insulating layer.

21. A Super Junction MOSFET device comprising;
a substrate heavily doped with a first conductivity type;
an epitaxial layer lightly doped with the first conductivity type on the substrate;
a plurality of deep trenches formed in the epitaxial layer surrounded by regions doped with a second conductivity type in the epitaxial layer wherein the second conductivity type is opposite to the first conductivity type and a plurality of MOSFET device structures that include a plurality of body regions on top of the regions doped with the second conductivity type, wherein the regions doped with the second conductivity type forms columns under the body regions in the epitaxial layer;
wherein sections of the columns in the epitaxial layer between adjacent deep trenches are separated by a region of the epitaxial layer therebetween and are substantially in charge balance with the region of the epitaxial layer, wherein an oxide layer lining the plurality of deep trenches has a linear gradient thickness reduced from top to bottom that has a difference between 40-200 angstroms.

22. The device of claim 21 wherein each of the plurality of deep trenches further comprises a dielectric at the opening of the deep trench and a void at the bottom of the deep trench.

23. The device of claim 22 wherein the dielectric at the opening of the deep trench is silicon dioxide.

24. The device of claim 21 wherein the plurality of deep trenches has a width between 0.2 and 1 microns and the regions doped with the second conductivity type extends 0.5 to 2 microns from a bottom of the plurality of deep trenches into the epitaxial layer.

* * * * *